United States Patent [19]

Tachiki et al.

[11] Patent Number: 5,403,698
[45] Date of Patent: Apr. 4, 1995

[54] NEGATIVE TYPE PHOTOSENSITIVE ELECTRODEPOSITING RESIN COMPOSITION

[75] Inventors: Sigeo Tachiki; Masahiko Hiro; Toshihiko Akahori; Takuro Kato; Hajime Kakumaru; Yoshitaka Minami, all of Hitachi; Yuhji Yamazaki, Otawara; Toshiya Takahashi, Kuroiso; Toshihiko Shiotani, Otawara; Yoshihisa Nagashima, Hiratsuka, all of Japan

[73] Assignees: Hitachi Chemical Company, Ltd.; Dai Nippon Toryo Co., Ltd., both of Tokyo, Japan

[21] Appl. No.: 774,809

[22] Filed: Oct. 11, 1991

[30] Foreign Application Priority Data

Oct. 16, 1990 [JP] Japan ............... 2-276987

[51] Int. Cl.$^6$ .............. G03C 1/725; C25D 13/00; C08F 2/46
[52] U.S. Cl. .............. 430/286; 430/285; 430/287; 430/324; 430/908; 430/910; 430/917; 204/180.6; 204/181.4; 522/16
[58] Field of Search .............. 204/180.6, 181.4; 430/922, 324, 285, 908, 910, 286, 287, 917, 935; 522/26, 16

[56] References Cited

U.S. PATENT DOCUMENTS

| | | | |
|---|---|---|---|
| 4,268,610 | 5/1981 | Roos | 430/281 |
| 4,680,249 | 7/1987 | Weed | 430/281 |
| 4,710,262 | 12/1987 | Weed | 156/630 |
| 4,741,987 | 5/1988 | Tohda et al. | 430/288 |
| 5,102,775 | 4/1992 | Okuhara et al. | 430/287 |

FOREIGN PATENT DOCUMENTS

| | | |
|---|---|---|
| 0204415 | 12/1986 | European Pat. Off. . |
| 0247549 | 12/1987 | European Pat. Off. . |
| 3600442 | 7/1986 | Germany . |
| 2153902 | 6/1990 | Japan . |

*Primary Examiner*—Marion E. McCamish
*Assistant Examiner*—Bernard Codd
*Attorney, Agent, or Firm*—Antonelli, Terry, Stout & Kraus

[57] ABSTRACT

A negative type photosensitive electrodepositing resin composition comprising (a) a polymer obtained by neutralizing a copolymer of acrylic or methacrylic acid and having an acid number of 20 to 300 with a basic organic compound, (b) a non-water-soluble monomer having two or more photopolymerizable unsaturated bonds in the molecule, (c) a non-water-soluble photoinitiator, and (d) a benzotriazole derivative having one or more carboxyl groups, is effective for giving electrodeposited films with a low voltage or low electric current in a short time, and usable for forming resist patterns with high degree of resolution.

13 Claims, No Drawings

NEGATIVE TYPE PHOTOSENSITIVE ELECTRODEPOSITING RESIN COMPOSITION

BACKGROUND OF THE INVENTION

The present invention relates to a negative type photosensitive electrodepositing resin composition, an electrodepositing bath using the same, and a process for producing a resist pattern using the same.

In the production of a printed circuit board, a layer of a photocurable resin composition is firstly formed on a substrate, then an actinic light is imagewisely projected, and the uncured area is removed by development to form a resist pattern. In this process, a variety of methods are adopted for forming the layer of photocurable resin composition. For example, a method of using a solution of photocurable resin composition (coating fluid) such as dip coating, roll coating, curtain coating, etc., and a method of laminating films of a photocurable resin composition (photosensitive films) are known. Among these methods, the method of laminating photosensitive films is predominantly adopted today because it can readily and easily give a layer of photocurable resin composition having an even thickness.

Currently, in the field of printed circuit board, there is a tendency of more and more enhancing the density and precision, as a result of which a resist pattern of more improved quality is requested. Thus, a resist pattern having no pin-hole and more tightly adhering to the surface of underlying substrate is demanded. A method of laminating photosensitive films predominant today, however, is known to be unable to cope with such a demand. Since a resist pattern formed by the method of laminating photosensitive films cannot sufficiently compensate unevennesses of substrate surface which appears due to flaws from impact at the time of producing the substrate, unevenness of grinding, network of glass cloth in the substrate, bits of copper plating onto surface, etc., it is difficult to obtain a sufficient adhesion. Although this difficulty may be avoidable by laminating the films under a reduced pressure (Japanese Patent Examined Publication No. 59-3740), this requires a special and expensive apparatus.

For the above-mentioned reason, solution coating methods such as dip coating, roll coating, curtain coating and the like have become remarked again in recent years. However, these coating methods are disadvantageous in that thickness of film is difficult to control and cannot be made uniform, and pin-holes appear.

Thus, as a new method, a method of forming a photosensitive film by electrodeposition has recently been proposed (Japanese Patent Unexamined Publication No. 62-235496). This method has the following merits: (1) adhesion of resist is improved, (2) the resist well follows the unevennesses of substrate surface, (3) a photosensitive film of uniform thickness can be formed in a short period of time, and (4) since the coating fluid is an aqueous solution, the pollution of working environment can be prevented and there is no problem from the viewpoint of disaster prevention. Thus, several proposals have recently been made about the formulation of electrodepositing bath suitable for this purpose.

Electrodeposition processes can be classified into anionic processes and cationic processes. In the production of printed circuit board, anionic processes are usually adopted because of the ease of post-treatment. However, the anionic process has a problem in that copper ion eluted from copper-lined laminate board at the time of electrodeposition forms a chelate with the carboxy group of resist material which functions as a pseudo-crosslinkage, so that, after exposure to light, the unexposed area cannot be removed (developed) by the use of an alkali solution. This phenomenon is hereinafter referred to as "imperfect development (or "resist scum")".

For solving this problem, a method of adding a compound capable of forming a chelate with copper such as β-diketones and acetoacetic esters (Japanese Patent Unexamined Publication No. 62-262865) and a method of adding an aminopolycarboxylic acid typified by ethylene-diamine-tetraacetic acid or salts thereof (Japanese Patent Unexamined Publication No. 61-247090) were proposed.

However, addition of these compounds could not sufficiently solve the problem, but in some cases aggravated the imperfectness of development.

SUMMARY OF THE INVENTION

It is an object of the present invention to overcome the above-mentioned faults of prior art by providing a negative type photosensitive electrodepositing resin composition improved in electrodepositing property and, when exposed to light and developed, capable of giving a resist pattern of high degree of resolution entirely free from imperfect development. It is another object of the present invention to provide an electrodeposition bath using said resin composition. It is yet another object of the present invention to provide a process for producing a resist pattern using said electrodepositing bath.

The present invention provides a negative type photosensitive electrodepositing resin composition comprising:

(a) a polymer prepared by copolymerizing acrylic acid and/or methacrylic acid to form a polymer having an acid number of 20–300 and neutralizing the polymer having an acid number with a basic organic compound, (b) a non-water-soluble monomer having two or more photopolymerizable unsaturated bonds in one molecule, (c) a non-water-soluble photoinitiator, and (d) at least one compound represented by the following formulae (I) and (II):

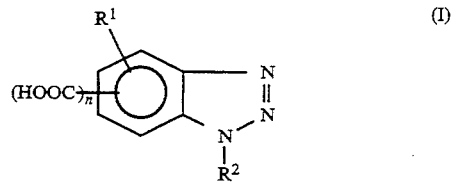

wherein $R^1$ represents a hydrogen atom, a halogen atom, a hydroxyl group, an alkyl group having 1 to 6 carbon atoms or an alkoxy group having 1 to 6 carbon atoms; $R^2$ represents a hydrogen atom, a hydroxyl group, an alkyl group having 1 to 6 carbon atoms, an ester group having 1 to 6 carbon atoms, a phenyl group or -X-$R^3$ provided that X is an alkylene group of 1 to 6 carbon atoms, cycloalkylene or alkylene ether group of 1 to 6 carbon atoms optionally substituted by a carboxyl group; $R^3$ is a hydroxyl group, an alkoxy group of 1 to 6 carbon atoms, a carboxyl group or a dialkylamino group; and n represents an integer of 1–3, provided that n may be 0 when $R^2$ has a carboxyl group;

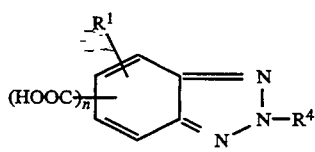

wherein $R^1$ is as defined in general formula (I); $R^4$ represents a hydrogen atom, an alkyl group of 1 to 3 carbon atoms or a phenyl group; and n represents an integer of 1–3.

The present invention further provides an electrodepositing bath comprising said negative type photosensitive electrodepositing resin composition.

The present invention further provides a process for producing a resist pattern which comprises dipping an electrically conductive substrate as an anode in said electrodepositing bath, carrying electricity to perform an electrodeposition so as to form an electrodeposited film on the electrically conductive substrate, thereafter irradiating an actinic light imagewisely onto the electrodeposited film to cure the area exposed to the light, and then removing the unexposed area by development.

DESCRIPTION OF THE PREFERRED EMBODIMENTS

After extensive studies, the present inventors found that addition of a carboxyl group-containing benzotriazole compound having a copper chelate-forming ability exercises a remarkable effect on the prevention of imperfect development (or resist scum). If simple benzotriazole having no carboxyl group is added, no preventive effect on imperfect development is observed at all. This explicitly demonstrates that addition of a compound merely capable of forming a copper chelate is insufficient for preventing imperfect development. Although the reason why the carboxyl group-containing benzotriazole derivative of the present invention can solve the problem of imperfect development to a remarkable extent is not yet fully known, it is considered that one of the reasons is attributable to that the compound of the invention has both a benzotriazole skeleton capable of forming a chelate with copper and a carboxyl group readily soluble or dispersible into alkaline developing solution.

Another important effect brought about by addition of the carboxyl group-containing benzotriazole derivative of the invention is improvement in electrodepositing property. Thus, if the carboxyl group containing benzotriazole derivative used in the present invention is added, an electrodepositing film (photosensitive film) having an intended film thickness is obtained at a lower voltage or lower current in a shorter period of time, as compared with a case of not adding such a derivative. This is favorable from the viewpoint of improving productivity, saving energy and improving safety of the work.

As has been mentioned above, by using the negative type photosensitive electrodepositing resin composition containing a carboxyl group-containing benzotriazole derivative, an electrodepositing bath excellent in electrodepositing property can be obtained and, in the formation of resist pattern using said bath, a high-resolution resist pattern free from imperfect development can be obtained.

The negative type photosensitive electrodepositing resin composition of the present invention comprises the following ingredients:
(a) a polymer prepared by copolymerizing acrylic acid and/or methacrylic acid to form a copolymer having an acid number of 20–300 and neutralizing it with a basic organic compound,
(b) a non-water-soluble monomer having two or more photopolymerizable unsaturated bonds in one molecule,
(c) a non-water-soluble photoinitiator, and
(d) at least one compound represented by the following general formulae (I) and (II):

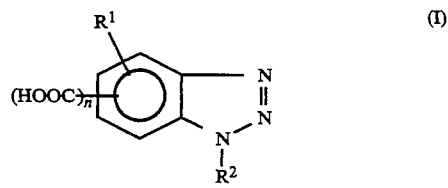

wherein $R^1$ represents hydrogen atom, halogen atom, hydroxyl group, alkyl group or alkoxy group having 1 to 6 carbon atoms; $R^2$ represents hydrogen atom, hydroxyl group, alkyl group having 1 to 6 carbon atoms, ester group having 1 to 6 carbon atoms, phenyl group or -X-$R^3$ provided that X is alkylene group of 1 to 6 carbon atoms, cycloalkylene or alkylene ether group of 1 to 6 carbon atoms optionally substituted by carboxyl group; and $R^3$ is hydroxyl group, alkoxy group of 1 to 6 carbon atoms, carboxyl group or dialkylamino group; and n represents an integer of 1–3, provided that n may be 0 when $R^2$ has a carboxyl group:

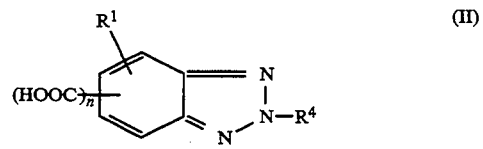

wherein $R^1$ is as defined in general formula (I); $R^4$ represents hydrogen atom, alkyl group of 1 to 3 carbon atoms or phenyl group; and n represents an integer of 1–3.

A resist pattern can be produced by dipping an electrically conductive substrate as an anode into an electrodepositing bath using the negative type photosensitive electrodepositing resin composition of the invention, carrying electricity to perform an electrodeposition so as to form an electrodeposited film on the electrically conductive substrate, thereafter irradiating an actinic light imagewisely onto the electrodeposited film to photo-cure the area exposed to the light, and removing the unexposed area by development to form a photo-cured resist pattern.

Hereinunder, the negative type photosensitive electrodepositing resin composition of the invention is illustrated in more detail.

The polymer constituting ingredient (a) is a polymer prepared by copolymerizing acrylic acid and/or methacrylic acid as indispensable components to form a copolymer having an acid number of 20–300 and neutralizing it with a basic organic compound. The acrylic acid and methacrylic acid can be used either singly or in their combination, and their amounts are appropriately adjusted so that acid number of the resulting copolymer comes to 20–300. If acid number of the copolymer is lower than 20, stability of the aqueous dispersion prepared by adding a basic organic compound to the photosensitive electrodepositing resin composition and dispersing it into water is low, so that the composition readily precipitates. If acid number of the copolymer is higher than 300, appearance of the electrodeposited film is inferior.

The polymer before neutralization is obtained by copolymerizing acrylic acid and/or methacrylic acid with one or more general polymerizable monomers such as methyl acrylate, methyl methacrylate, ethyl methacrylate, butyl methacrylate, ethyl acrylate, isopropyl acrylate, n-butyl acrylate, isobutyl acrylate, n-hexyl acrylate, n-octyl acrylate, n-octyl methacrylate, n-decyl methacrylate, cyclohexyl methacrylate, 2-hydroxyethyl acrylate, cyclohexyl methacrylate, acrylonitrile, styrene, vinyl chloride and the like.

Among these monomers, the use of methyl methacrylate is preferable. Particularly when methyl methacrylate is used in an amount of 60 to 85 parts by weight per 100 parts by weight of the total of commoners, the resulting resist film has no stickiness and is hardly suffered from scratch or injury. In such a case, when a number of resist films are laminated, no sticking takes place, resulting in preferably making it possible to pile a number of substrates each having a resist film thereon.

The polymer before neutralization can be synthesized by a conventional solution polymerization of the above-mentioned monomers in an organic solvent using a polymerization initiator such as azobisisobutyronitrile, azobisdimethylvaleronitrile, benzoyl peroxide and the like. Since the copolymer solution obtained herein is used for electrodeposition, it is desirable to use hydrophilic organic solvents such as dioxane, ethylene glycol monomethyl ether, propylene glycol monomethyl ether, ethylene glycol monoacetate, diethylene glycol monoethyl ether acetate and the like as main component of the polymerization solvent. When a hydrophobic organic solvent such as toluene, xylene, benzene and the like is mainly used as the polymerization solvent, accordingly, the solvent must be distilled off and renewed with the above-mentioned hydrophilic ones after synthesis of the copolymer. Before neutralization, the copolymer preferably has a weight-average molecular weight of 5,000–150,000 as expressed in terms of standard polystyrene. If it is lower than 5,000, the resist is low in mechanical strengths. If it is higher than 150,000, the electrodepositing performances are inferior and the electrodeposited film is inferior in appearance.

The polymer constituting ingredient (a) is used preferably in an amount of 50–85 parts by weight, more preferably in an amount of 60–75 parts by weight, per 100 parts by weight of the total amount of ingredients (a) and (b). If the amount of (a) is smaller than 50 parts by weight, the resist is low in mechanical strengths and inferior in stiffness. If the amount of (a) is greater than 85 parts by weight, the proportion of the photo-polymerizable monomer constituting ingredient (b) is too small and sensitivity to light is low.

As examples of the non-water-soluble monomer having two or more photopolymerizable unsaturated bonds in one molecule constituting ingredient (b), the followings can be referred to: compounds obtained by adding an α,β-unsaturated carboxylic acid to polyhydric alcohols except for polyethylene glycols prepared by condensing one or more ethylene glycol molecules, such as trimethylolpropane di(meth)acrylate, trimethylolpropane tri(meth)acrylate, tetramethylolmethane tri(meth)acrylate, dipentaerythritol tetra(meth)acrylate, dipentaerythritol hexa(meth)acrylate, etc.; compounds obtained by adding an α,β-unsaturated carboxylic acid to glycidyl group-containing compounds such as trimethylolpropane triglycidyl ether triacrylate, Bisphenol A diglycidyl ether di(meth)acrylate and the like; ester compounds formed between a polybasic carboxylic acid such as phthalic anhydride and the like and a compound having a hydroxyl group and an ethylenically unsaturated bond such as β-hydroxyethyl (meth)acrylate and the like; and the like. Urethane diacrylate compounds and the like having a urethane skeleton are also usable. At any rate, any substances can be used so far as they are non-water-soluble and curable by photo-irradiation. In this sense, hydrophilic monomers such as (poly)ethylene glycol diacrylate and the like are out of the scope of the present invention. These non-water-soluble monomers of the present invention can be used either singly or in combination of two or more members. The ingredient (b) is used preferably in an amount of 15–50 parts by weight, more preferably in an amount of 25–40 parts by weight, per 100 parts by weight of the total amount of ingredients (a) and (b). If the amount of ingredient (b) is smaller than 15 parts by weight, sensitivity to light is not good. If its amount is greater than 50 parts by weight, the resist is brittle.

Examples of the non-water-soluble photoinitiator or photoinitiator system constituting ingredient (c) include aromatic ketones such as benzophenone, N,N'-tetramethyl-4,4'-diaminobenzophenone, 4-methoxy-4'-dimethylaminobenzophenone, 2-ethylanthraquinone, phenanthrenequinone and the like; benzoin ethers such as benzoin methyl ether, benzoin ethyl ether, benzoin phenyl ether and the like; benzoins such as methylbenzoin, ethylbenzoin and the like; and imidazole dimers such as 2-(o-chlorophenyl)-4,5-diphenyl-imidazole dimer, 2-(o-chlorophenyl)-4,5-di(m-methoxyphenyl)-imidazole dimer, 2,4-di(p-methoxyphenyl)-5-phenylimidazole dimer and the like. These compounds may be used either singly or in the form of a mixture of two or members. Ingredient (c) is used preferably in an amount of 0.1–15 parts by weight, more preferably in an amount of 0.2–10 parts by weight, per 100 parts by weight of the total weight of (a) and (b). If its amount is smaller than 0.1 part by weight, sensitivity to light tends to decrease. If its amount is greater than 15 parts by weight, the light absorption at the surface upon exposure to light increases, so that the photo-cure in the inner region tends to become insufficient.

Ingredients (b) and (c) must be non-water-soluble. If they are soluble in water, it is difficult to carry out the electrodeposition in a state that these ingredients are uniformly mixed with other ingredients.

Examples of the compounds represented by general formulas (I) and (II) constituting ingredient (d) include the followings.

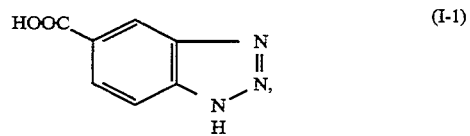

(I-1)

-continued
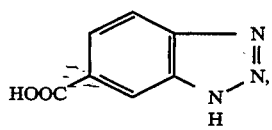
(I-2)
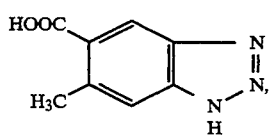
(I-3)
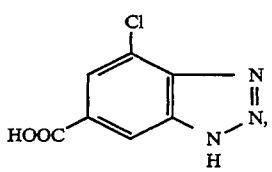
(I-4)
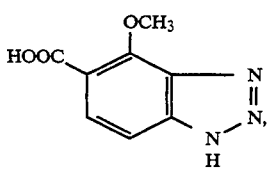
(I-5)
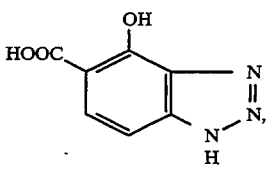
(I-6)
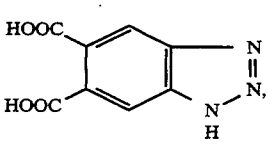
(I-7)
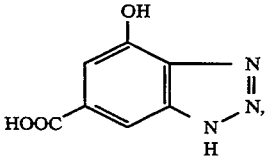
(I-8)
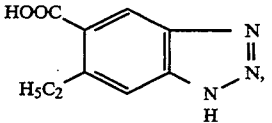
(I-9)
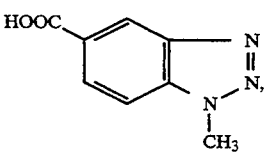
(I-10)
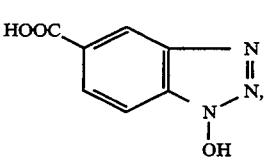
(I-11)
-continued
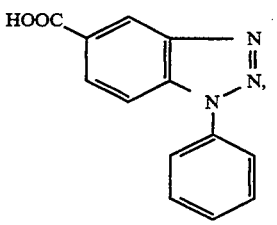
(I-12)
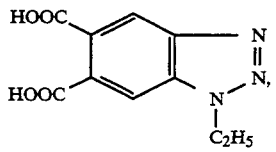
(I-13)
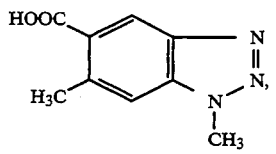
(I-14)
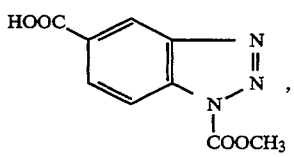
(I-15)
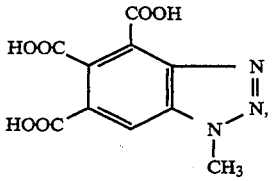
(I-16)
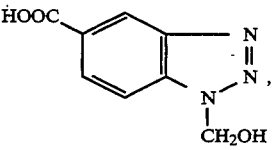
(I-17)
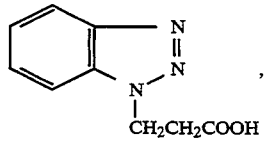
(I-18)
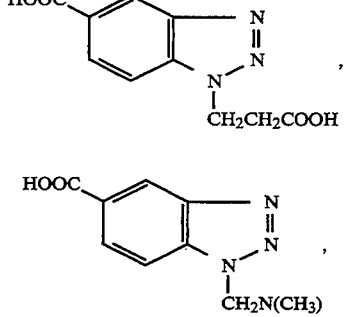
(I-19)
(I-20)

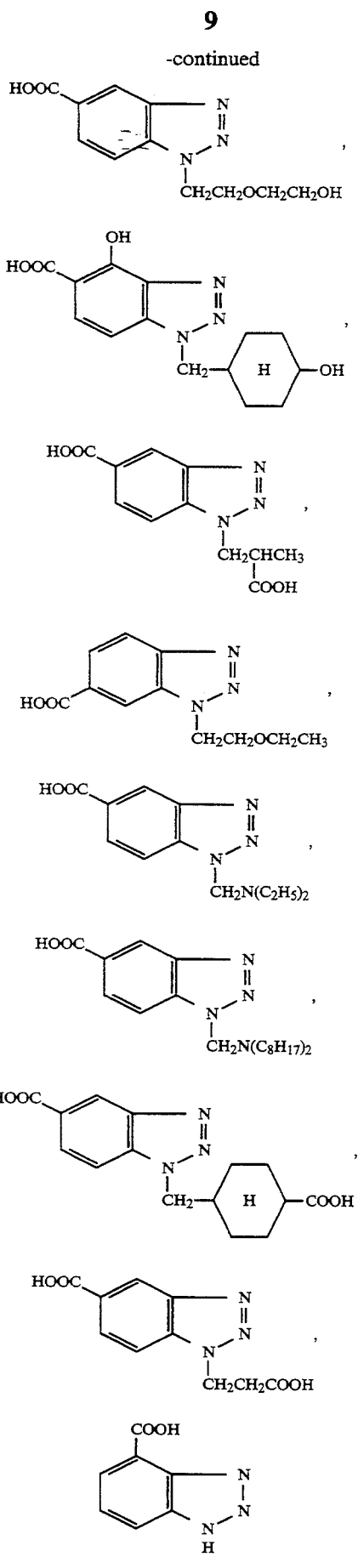

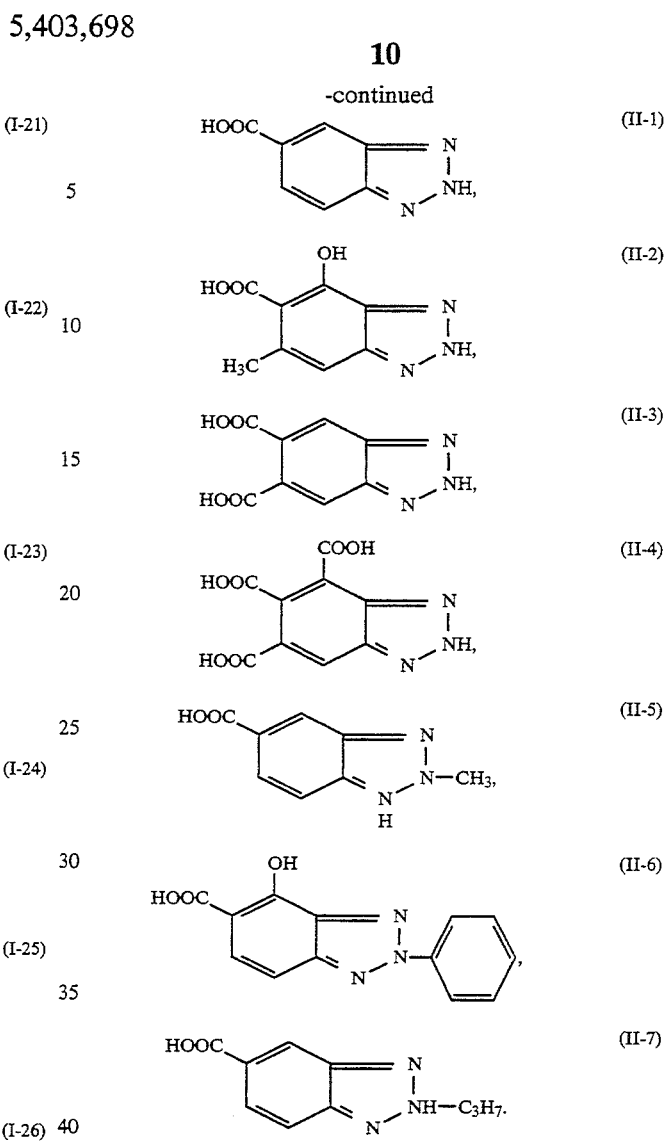

These compounds may be used either singly or in the form of a mixture of two or more members. Ingredient (d) is used preferably in an amount of 0.1–15 parts by weight, more preferably in an amount of 0.5–8 parts by weight, per 100 parts by weight of the total amount of (a), (b) and (c). If its amount is smaller than 0.1 part by weight, addition of ingredient (d) brings about only a small effect of eliminating the imperfect development and improving the electrodepositing property. If its amount is larger than 15 parts by weight, stability of the electrodepositing bath tends to decrease.

Into the photosensitive electrodepositing resin composition of the invention, colorants such as dyes, pigments and the like may be incorporated. Examples of the colorant include Fuchsine, Auramine bases, Crystal Violet Red, Victoria Pure Blue, Malachite Green, Methyl Orange, Acid Violet RRH and the like.

Into the photosensitive resin composition of the invention, thermal polymerization inhibitor, plasticizer, adhesion accelerator, inorganic filler and the like may be incorporated.

For preparing an electrodepositing bath comprising the above-mentioned ingredients (a), (b), (c) and (d), it is desirable to make the ingredients (a), (b), (c) and (d) into uniform solutions in the above-mentioned hydrophilic organic solvents. The hydrophilic organic solvents that may be used for the synthesis of polymer before neutralization may be used as is. Otherwise, it is also allowable to once distill off the solvent used for the synthesis of polymer before neutralization and then add another hydrophilic organic solvent. The hydrophilic organic solvent may be a combination of two or more members. The hydrophilic organic solvent is used preferably in an amount of 300 parts by weight or less per 100 parts by weight of the solid ingredient comprising (a), (b), (c) and (d). Next, a basic organic compound is added to the above-mentioned solution to neutralize carboxyl groups of the polymer before neutralization, whereby the polymer can be made more readily soluble or dispersible into water. Although the basic organic compound herein used is not critical, triethylamine, monoethanolamine, diethanolamine, diisopropylamine, dimethylaminoethanol, morpholine and the like are used for this purpose, and they may be used either singly or in the form of a mixture of two or more members. Preferably, these basic organic compounds are used in an amount of 0.3–1.0 equivalent per one equivalent of the carboxyl group in the polymer before neutralization. If its amount is smaller than 0.3 equivalent, stability of the aqueous dispersion constituting the electrodepositing bath is not good. If its amount is greater than 1.0 equivalent, thickness of the electrodeposited film is small and appearance is not good.

The use of basic inorganic compounds such as sodium hydroxide, potassium hydroxide and the like is undesirable, because their use is apt to cause a hydrolysis of the negative type photosensitive electrodepositing resin composition.

Usually, the electrodepositing bath can be prepared by dissolving or dispersing the negative type photosensitive electrodepositing resin composition into water. From the viewpoint of controlling the bath and electrodepositing property, it is preferable to adjust the solid content of the electrodepositing bath to 5–20% by weight and pH of the bath to 6.0–9.0. In order to adjust pH value to the above-mentioned range, the above-mentioned basic organic compounds may be added afterwards for the purpose of regulation.

In order to improve the water-dispersibility and dispersion stability of the electrodepositing bath comprising the negative type photosensitive electrodepositing resin composition, a nonionic surfactant, a cationic surfactant, an anionic surfactant and the like may be appropriately added to the bath.

In order to increase the coating quantity at the time of electrodeposition, a hydrophobic solvent such as toluene, xylene, 2-ethylhexyl alcohol and the like may be added appropriately.

In carrying out electrodeposition onto an electrically conductive substrate with the electrodepositing bath thus obtained, an electrically conductive substrate is dipped as an anode in an electrodepositing bath and a direct current voltage of 50–400 V is usually applied for a period of 10 seconds to 5 minutes. Thickness of the electrodeposition film thus formed is preferably 5–50 μm. In this treatment, temperature of the electrodeposition bath is preferably regulated in the range of 15°–30° C.

After the electrodeposition, the electrodeposition-coated product is withdrawn from the electrodeposition bath, water is drained off therefrom, and then the product is dried by means of hot air or the like. If the drying temperature is too high, the electrodeposited film is thermally cured and causes partial imperfect development in the developing process after exposure to light. Therefore, it is usually preferable to carry out the drying at a temperature not exceeding 110° C.

Over the electrodeposited film thus obtained, a film of water-soluble polymer such as polyvinyl alcohol and the like having a thickness of about 1 μm to about 10 μm may be formed to protect the film and prevent the retardation of cure caused by oxygen in the next step of exposure to light.

Subsequently, an actinic light is imagewisely irradiated to the electrodeposited film to photo-cure the exposed area of the film, and the unexposed area is removed by development, whereby a photo-cured resist pattern can be obtained. As the light source of the actinic light, those emitting rays having a wavelength of 300–450 nm, such as mercury vapor arc, carbon arc, xenon arc and the like are preferably used.

The development is carried out by spraying an aqueous solution containing an alkali such as sodium hydroxide, sodium carbonate, potassium hydroxide and the like or by dipping the exposed substrate into an aqueous solution of alkali.

Next, the present invention will be illustrated by way of the following examples.

EXAMPLE 1

Into a flask equipped with a stirrer, a reflux condenser, a thermometer, a dropping funnel and a nitrogen gas inlet tube was charged 1,130 g of dioxane. While stirring the dioxane and blowing nitrogen gas, it was heated to 90° C. When a steady temperature of 90° C. was reached, a liquid mixture consisting of 169 g of methacrylic acid, 250 g of methyl methacrylate, 381 g of n-butyl acrylate, 200 g of ethyl methacrylate and 10 g of azobisisobutyronitrile was dropwise added into the flask over a period of 2.5 hours and thereafter stirred for 3 hours at 90° C. Three hours after start of the reaction, 3 g of azobisisobutyronitrile dissolved in 100 g of dioxane was dropwise added into the flask over a period of 10 minutes, and the resulting mixture was stirred for 4 hours at 90° C.

The polymer thus obtained as a precursor of ingredient (a) had a weight average molecular weight of 55,000 and an acid number of 109. The polymer solution had a solid content of 45.1% by weight.

Next, into 650 g of the polymer solution were added and dissolved 150 g of EO-modified Bisphenol A dimethacrylate (manufactured by Shin-Nakamura Kagaku Kogyo, trade name NK Ester BPE-200) and 25 g of hexanediol dimethacrylate (manufactured by Shin-Nakamura Kagaku Kogyo, trade name NK Ester HD) as ingredient (b), 30 g of benzophenone and 1 g of N,N'-tetraethyl-4,4'-diaminobenzophenone as ingredient (c), and 5 g of the Compound (I-1) as ingredient (d).

Into the solution was added and dissolved 31.8 g of dimethylaminoethanol as a basic organic compound to neutralize the polymeric precursor of ingredient (a) present in the solution. Then, while stirring the solution, 4,200 g of deionized water was slowly added dropwise to prepare an electrodepositing bath. The electrodepositing bath thus obtained had a solid content of 10% by weight and a pH value of 7.85 at 25° C.

EXAMPLE 2

In a flask equipped with the same accessories as in Example 1, 1,130 g of ethyl Cellosolve was heated to 90° C. with stirring while blowing nitrogen gas. When a steady temperature of 90° C. was reached, a liquid mixture consisting of 230 g of methacrylic acid, 367 g of methyl methacrylate, 250 g of ethyl acrylate, 153 g of methyl acrylate and 10 g of azobisisobutyronitrile were dropwise charged into the flask over a period of 2 hours. Then, the resulting mixture was stirred at 90° C. for 3 hours. Three hours after start of the reaction, 5 g of azobisisobutyronitrile dissolved in 100 g of ethyl Cellosolve was dropwise added over a period of 10 minutes, and the resulting mixture was stirred at 90° C. for 4 hours.

The polymer thus obtained as a precursor of ingredient (a) had a weight average molecular weight of 41,000 and an acid number of 157. The polymer solution had a solid content of 45.3% by weight.

Next, into 557 g of the polymer solution were added and dissolved 150 g of epoxy acrylate (manufactured by Osaka Yuki Kagaku Kogyo, trade name Biscoat 540) and 60 g of urethane acrylate (manufactured by Shin-Nakamura Kagaku Kogyo, trade name U-108-A) as ingredient (b), 33 g of benzophenone and 0.8 g of N,N'-tetraethyl-4,4'-diaminobenzophenone as ingredient (c) and 15 g of Compound (I-26) as ingredient (d). Then, 39 g of morpholine as a basic organic compound was added to the resulting solution to neutralize the polymeric precursor of ingredient (a) in the solution. Then, 100 g of n-butanol was added and dissolved uniformly.

Then, 4,100 g of deionized water was slowly added to the solution dropwise with stirring to prepare an electrodepositing bath. The electrodepositing bath thus obtained had a solid content of 10% by weight and a pH value of 7.48 at 25° C.

EXAMPLE 3

In a flask equipped with the same accessories as in Example 1, 900 g of ethyl Cellosolve was heated to 90° C. with stirring while blowing nitrogen gas. When a steady temperature of 90° C. was reached, a liquid mixture consisting of 141 g of acrylic acid, 510 g of methyl methacrylate, 320 g of n-propyl acrylate, 29 g of methyl acrylate and 2.5 g of azobisisobutyronitrile was dropwise charged into the flask over a period of 2 hours. Then, the resulting mixture was stirred at 90° C. for 3 hours. Three hours after start of the reaction, 1.0 g of azobisisobutyronitrile dissolved in 100 of the ethyl Cellosolve was dropwise added over a period of 10 minutes, and the resulting mixture was stirred at 90° C. for 4 hours.

The polymer thus obtained as a precursor of ingredient (a) had a weight average molecular weight of 62,000 and an acid number of 107. The polymer solution had a solid content of 50.3% by weight.

Next, into 750 g of the polymer solution were added and dissolved 100 g of pentaerythritol tetraacrylate (manufactured by SARTOMER Company, trade name SR-295) and 25 g of tris(acryloxyethyl) isocyanurate (manufactured by Hitachi Chemical Co., Ltd., trade name FA-731A) as ingredient (b), 30 g of benzophenone and 1 g of N,N'-tetraethyl-4,4'-diaminobenzophenone as ingredient (c) and 2.5 g of Compound (I-1) as ingredient (d). Then, 16 g of triethylamine as a basic organic compound was added to the resulting solution to neutralize the polymeric precursor of ingredient (a) present in the solution. Then, while stirring the solution, 4,400 g of deionized water was slowly added to prepare an electrodepositing bath. The electrodepositing bath thus obtained had a solid content of 10% by weigh and a pH value of 7.75 at 25° C.

EXAMPLE 4

In the same flask as used in Example 1, 1130 g of propylene glycol monopropyl ether was placed and stirred while introducing a nitrogen gas with heating to 100° C. When the temperature became constant at 100° C., a mixed solution containing 192 g of methacrylic acid, 780 g of methyl methacrylate, 28 g of ethyl acrylate and 10 g of azobisisobutyronitrile was added dropwise to the flask in 3 hours, followed by stirring for 3.5 hours while maintaining the temperature at 100° C. Then, a solution obtained by dissolving 5 g of azobisdimethylvaleronitrile in 100 g of propylene glycol monopropyl ether was added dropwise to the flask in 10 minutes, followed by stirring for 4 hours while maintaining the temperature at 100° C.

The resulting polymer as a precursor of the component (a) had a weight average molecular weight of 35,000 and an acid number of 125. Further, the solid content of the polymer solution was 45.3% by weight.

To the resulting polymer solution in an amount of 700 g, 80 g of dipentaerythritol hexaacrylate (DPHA, a trade name, manufactured by NIPPON KAYAKU CO., LTD.) as the component (b), 30 g of benzophenone and 1 g of N,N'-tetraethyl-4,4'-diaminobenzophenone as the component (c), 8 g of the above-mentioned compound (I-1) as the component (d) and 100 g of propylene glycol monomethyl ether were added and dissolved, followed by addition of 22 g of triethylamine as the basic organic compound for dissolution so as to neutralize the polymer as the precursor of the component (a).

Then, 3700 g of deionized water was gradually added while stirring the solution to obtain an electrodepositing bath. The electrodepositing bath had a solid content of 9.5% by weight and a pH of 7.52 at 25° C.

Comparative Example 1

An electrodepositing bath was prepared by using the same materials and procedure as in Example 1, except that the Compound (I-1) constituting ingredient (d) was not added.

Comparative Example 2

An electrodepositing bath was prepared by using the same materials and procedure as in Example 1, except that the ingredient (d) was replaced with 5 g of benzotriazole.

Comparative Example 3

An electrodepositing bath was prepared by using the same materials and procedure as in Example 1, except that the ingredient (d) was replaced with 5 g of acetylacetone.

Comparative Example 4

An electrodepositing bath was prepared by using the same materials and procedure as in Example 1, except that the ingredient (d) was replaced with 5 g of ethylenediaminetetraacetic acid.

Into each of the electrodepositing baths prepared in Examples 1–4 and Comparative Examples 1–4, a glass-epoxy copper-lined laminate (manufactured by Hitachi Chemical Co., Ltd., trade name MCL-E-61) (200 mm × 75 mm) as an anode and a stainless steel plate (SUS304) (200 mm × 75 mm × 75 mm × 1 mm) as a cathode were dipped. A direct current voltage was applied for 3 minutes at 25° C. to form an electrodeposited film (photosensitive film) on the surface of the copper-lined laminate. Table 1 illustrates the voltage applied and the thickness of the electrodeposited film. After washing the laminate with water and draining the water, it was dried at 80° C. for 15 minutes.

Then, the laminate was imagewisely exposed to a light of 3 kW super-high pressure mercury lamp via a negative mask. The quantity of the light was 60 mJ/cm$^2$. Then it was developed with a 1% by weigh aqueous solution of sodium carbonate. With the aim of checking the occurrence of imperfect development, the substrate having been developed was dipped in a 1% by weight aqueous solution of copper chloride for a period of one minute and the extent of etching in the unexposed area of the substrate was visually examined. The results are also shown in Table 1.

TABLE 1

Electrodepositing property and imperfect development

| | Applied voltage (V) | Thickness of electro-deposited film (μm) | Etching in unexposed area[1] |
|---|---|---|---|
| Example 1 | 130 | 15 | o |
| Example 2 | 160 | 16 | o |
| Example 3 | 110 | 15 | o |
| Example 4 | 130 | 16 | o |
| Comparative Example 1 | 200 | 13 | x |
| Comparative Example 2 | 200 | 14 | xx |
| Comparative Example 3 | 200 | 13 | xx |
| Comparative Example 4 | 200 | 13 | x |

Note [1]Etching in unexposed area
o: Good (No imperfect development noticeable)
x: Not good (Imperfect development noticeable)
xx: Very bad (Imperfect development much noticeable)

It is apparent from Table 1 that the compositions of Examples 1–4 containing the carboxyl group-containing benzotriazole derivative of the present invention all give an at least equal film thickness at a lower voltage and are improved in electrodepositing property, as compared with the composition of Comparative Example 1 not containing the derivative.

On the other hand, the compositions of Comparative Examples 2–4 are comparable to the composition of Comparative Example 1 in electrodepositing property, demonstrating that addition of chelating agent does not bring about an improvement in electrodepositing property. That is, the improvement in electrodepositing property observed in Examples 1–4 of the present invention is attributable to the addition of the carboxyl group-containing benzotriazole derivative of the invention. This is an important characteristic feature of the present invention.

As to the etching in the unexposed area, Comparative Example 1 shows a certain extent of imperfect etching or an imperfect development. On the other hand, Comparative Examples 2 and 3 hardly show etching, and in these cases the imperfect development is rather aggravated as compared with Comparative Example 1.

In Examples 1–4 where a carboxyl group-containing benzotriazole derivative was added, the unexposed area was completely etched, and no imperfect development was observed at all. In these cases, the elimination of imperfect development is attributable not to addition of chelating agent but to the use of carboxyl group-containing benzotriazole derivative. This is an important characteristic feature of the present invention.

Needless to say, the resist patterns of Examples 1–3 obtained after development had good shapes of resist of which degree of resolution was 50 μm.

The resist obtained in Example 4 was the least in stickiness of the electrodeposited films after electrodeposition among the resists obtained in Examples 1 to 4. Thus, even if resists were piled, no stickiness took place and injury hardly took place.

Owing to the use of the electrodepositing bath containing the negative type photosensitive electrodepositing resin composition of the present invention, electrodepositing property can be made better than in prior art. Further, by exposure to light and development, there can be obtained a resist pattern entirely free from imperfect development.

The resist obtained by the production process of resist pattern of the present invention can be used as a relief. Further, it can be applied to formation of photoresist for etching or plating by using a copper-lined laminate as a substrate.

What is claimed is:

1. A negative type photosensitive electrodepositing resin composition comprising:
   (a) a polymer prepared by copolymerizing acrylic acid and/or methacrylic acid to form a polymer having an acid number of 20–300 and neutralizing the polymer having an acid number with a basic organic compound,
   (b) a non-water-soluble monomer having two or more photopolymerizable unsaturated bonds in one molecule,
   (c) a non-water-soluble photoinitiator, and
   (d) at least one compound represented by the following general formulae (I) and (II):

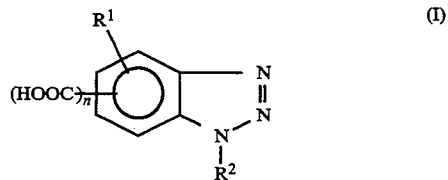

(I)

wherein $R^1$ represents a hydrogen atom, a halogen atom, a hydroxyl group, an alkyl group having 1 to 6 carbon atoms or an alkoxy group having 1 to 6 carbon atoms; $R^2$ represents a hydrogen atom, a hydroxyl group, an alkyl group having 1 to 6 carbon atoms, an ester group having 1 to 6 carbon atoms, a phenyl group or -X-$R^3$ provided that X is an alkylene, cycloalkylene or alkylene ether group of 1 to 6 carbon atoms optionally substituted by a carboxyl group; and $R^3$ is a hydroxyl group, an alkoxy group of 1 to 6 carbon atoms, a carboxyl group or a dialkylamino group; and n is an integer of 1–3, provided that n can be 0 when $R^2$ has a carboxyl group;

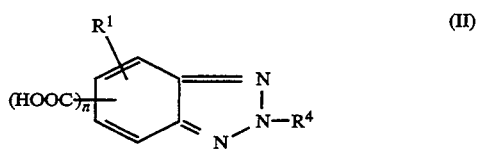

(II)

wherein $R^1$ is as defined in general formula (I), $R^4$ represents a hydrogen atom, an alkyl group of 1 to 3 carbon atoms or a phenyl group; and n represents an integer of 1-3.

2. A composition according to claim 1, which further comprises (e) water.

3. A composition according to claim 1, wherein neutralization to form the polymer (a) is effected with a basic organic compound in an amount of 0.3 to 1.0 equivalent per equivalent of the carboxyl group in the polymer having an acid number before neutralization.

4. A composition according to claim 1, wherein the basic organic compound is triethylamine, monoethanolamine, diethanolamine, diisopropylamine, dimethylaminoethanol, morpholine, or a mixture thereof.

5. A composition according to claim 1, wherein the polymer (a) is obtained by copolymerizing acrylic acid and/or methacrylic acid with at least one monomer selected from the group of methyl acrylate, methyl methacrylate, ethyl methacrylate, butyl methacrylate, ethyl acrylate, isopropyl acrylate, n-butyl acrylate, isobutyl acrylate, n-hexyl acrylate, n-octyl acrylate, n-octyl methacrylate, n-decyl methacrylate, cyclohexyl methacrylate, 2-hydroxyethyl acrylate, cyclohexyl methacrylate, acrylonitrile, styrene, and vinyl chloride.

6. The composition according to claim 1, wherein (a) is present in an amount of 50–80 parts by weight per 100 parts by weight of (a) and (b) ; (b) is present in an amount of 15 parts by weight per 100 parts by weight of (a) and (b); (c) is present in an amount of 0.1–50 parts by weight per 100 parts by weight of (a) and (b) ; and (d) is present in an amount of 0.1 to 15 parts by weight per 100 parts by weight of the total amount of (a), (b) and (c).

7. The composition according to claim 1, wherein the compound (d) is selected from

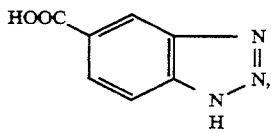

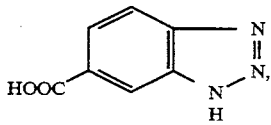

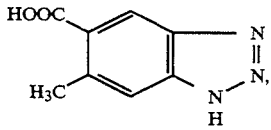

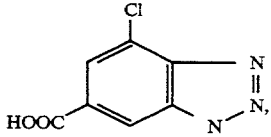

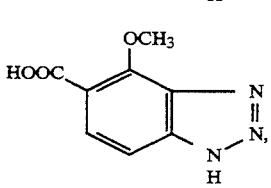

-continued

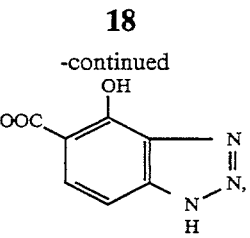

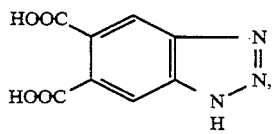

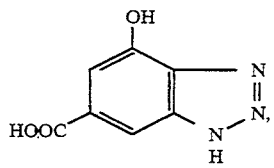

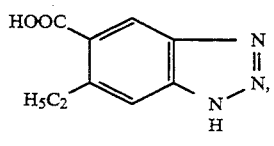

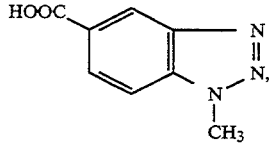

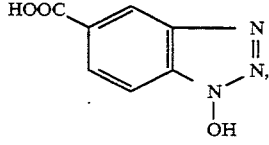

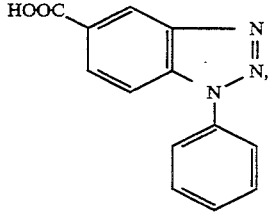

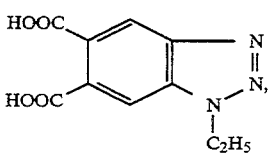

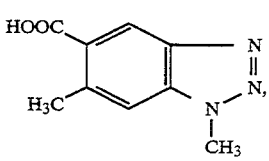

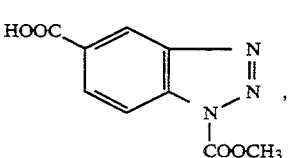

-continued
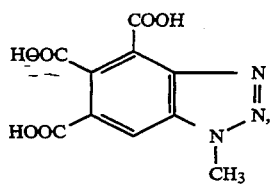
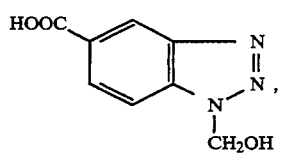
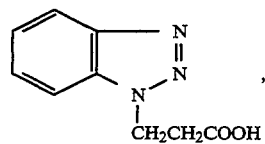
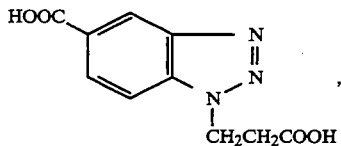
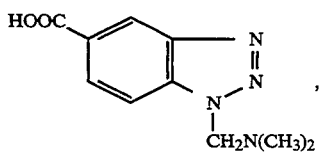
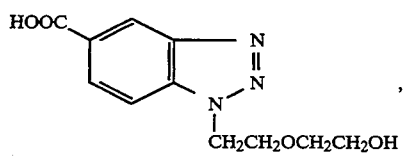
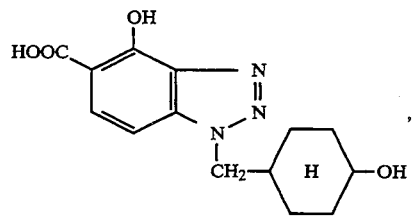
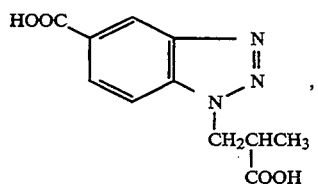
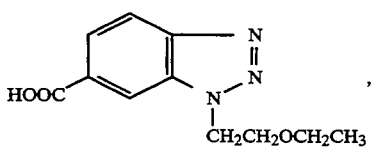
-continued
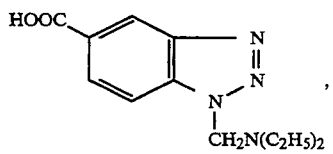
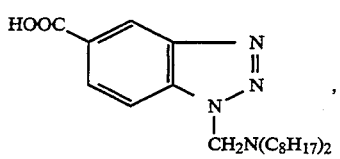
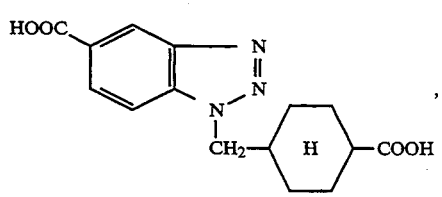
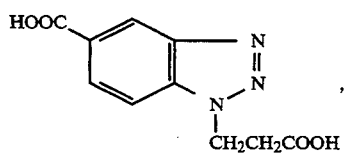
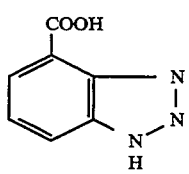
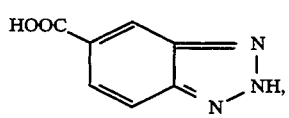
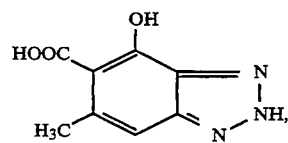
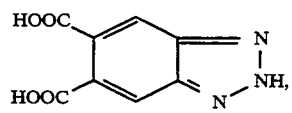
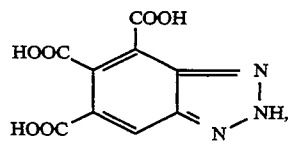
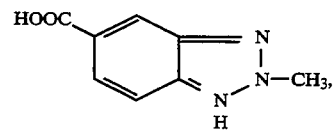

-continued

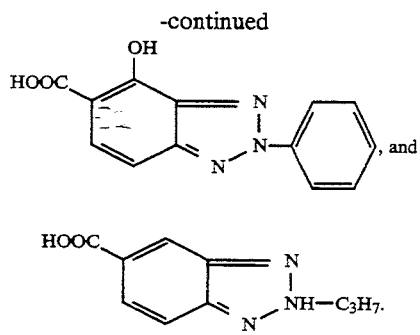, and

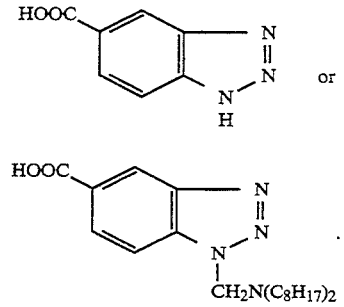 or

8. The composition according to claim 7, wherein neutralization to form the polymer (a) is effected with a basic organic compound in an amount of 0.3 to 1.0 equivalent per equivalent of the carboxyl group in the polymer having an acid number before neutralization.

9. A composition according to claim 1, wherein the compound (d) is

10. An electrodepositing bath comprising a negative type photosensitive electrodepositing resin composition of claim 1.

11. An electrodepositing bath according to claim 10, wherein the pH of the bath is 6.0 to 9.0.

12. An electrodepositing bath according to claim 10, which further comprises nonionic surfactant, a cationic surfactant, or an anionic surfactant.

13. An electrodepositing bath according to claim 10, wherein the solids content of the bath is adjusted to 5-20% by weight.

* * * * *